United States Patent
Li (10) Patent No.: US 7,539,256 B2
(45) Date of Patent: May 26, 2009

(54) DECODING DEVICE AND DECODING METHOD

(75) Inventor: Jifeng Li, Beijin (CN)

(73) Assignee: Panasonic Corporation, Osaka (JP)

( * ) Notice: Subject to any disclaimer, the term of this patent is extended or adjusted under 35 U.S.C. 154(b) by 589 days.

(21) Appl. No.: 10/563,559

(22) PCT Filed: Jul. 9, 2004

(86) PCT No.: PCT/JP2004/009846

§ 371 (c)(1), (2), (4) Date: Feb. 3, 2006

(87) PCT Pub. No.: WO2005/006564

PCT Pub. Date: Jan. 20, 2005

(65) Prior Publication Data

US 2006/0176945 A1    Aug. 10, 2006

(30) Foreign Application Priority Data

Jul. 11, 2003    (JP) .............................. 2003-273378

(51) Int. Cl.
*H04L 5/12* (2006.01)
(52) U.S. Cl. ...................... 375/265; 375/346; 714/755; 714/786
(58) Field of Classification Search ............... 375/262, 375/265, 285, 341, 346; 714/746, 752, 755, 714/786, 792, 794, 795, 796
See application file for complete search history.

(56) References Cited

U.S. PATENT DOCUMENTS 5,933,462 A    8/1999    Viterbi et al.

| | | | |
|---|---|---|---|
| 6,563,890 B2 * | 5/2003 | Obuchi et al. | 375/341 |
| 6,952,457 B2 * | 10/2005 | Blankenship et al. | 375/340 |
| 7,027,531 B2 * | 4/2006 | Blankenship et al. | 375/341 |

(Continued)

FOREIGN PATENT DOCUMENTS

| JP | 2000 295115 | 10/2000 |
| JP | 2001 267938 | 9/2001 |
| JP | 2003 163599 | 6/2003 |
| WO | 0052833 | 9/2000 |

OTHER PUBLICATIONS

PCT International Search Report dated Oct. 12, 2004.

(Continued)

*Primary Examiner*—Dac V Ha
(74) *Attorney, Agent, or Firm*—Dickinson Wright, PLLC (57) ABSTRACT

A decoding apparatus that is capable of calculating of the likelihood information at high speed while suppressing increases in processing amount and in circuit scale. In this apparatus, in computations of the backward probability in a backward probability computing section (112), while one processing system calculates the backward probability $\beta_k$ from the backward probability $\beta_{k+2}$, the other processing system calculates the backward probability $\beta_{k-1}$ from the backward probability $\beta_{k+1}$ in parallel. Specifically considering the case of k=1, backward probabilities $\beta_1$, and $\beta_0$ are calculated in parallel in two processing systems. The calculated backward probabilities are stored in a storage section (114) on a window basis. Further, as in the backward probability, in a forward probability computing section (113), forward probabilities $\alpha_k$ and $\alpha_{k+1}$ are calculated in parallel in two processing systems. When the forward probabilities are calculated, a likelihood computing section (115) calculates the likelihood information using the forward probabilities and backward probabilities stored in storage section 114.

5 Claims, 6 Drawing Sheets

U.S. PATENT DOCUMENTS

| | | | |
|---|---|---|---|
| 7,246,295 B2* | 7/2007 | Xu | 714/755 |
| 2001/0046269 A1 | 11/2001 | Gatherer et al. | |
| 2002/0012408 A1 | 1/2002 | Nieminen | |
| 2002/0015457 A1 | 2/2002 | Obuchi et al. | |
| 2003/0110438 A1 | 6/2003 | Pan et al. | |
| 2003/0154441 A1* | 8/2003 | Mieminen | |
| 2007/0113144 A1* | 5/2007 | Li | |

OTHER PUBLICATIONS

A. J. Viterbi; "An Intuitive Justification and a Simplified Implementation of the MAP Decoder for Convolutional Codes," IEEE Journal of Selected Areas in Communications, vol. 16, No. 2, Feb. 1998, pp. 260-264.

Supplementary European Search Report dated Jun. 16, 2006.

M. El-Assal, et al., "A High Speed Architecture for Map Decoder," IEEE, XP010616579, Oct. 16, 2002, pp. 69-74.

M. Bickerstaff, et al., "A 24Mb/s Radix-4 LogMAP Turbo Decoder for 3GPP-HSDPA Mobile Wireless," Regular Paper ISSCC, XP010661378, Feb. 9, 2003, pp. 1-10.

Z. Wang, et al., Area-Efficient High-Speed Decoding Schemes for Turbo Decoders, IEEE Transactions on Very Large Scale Integration (VLSI) Systems, XP-002335788, vol. 10, No. 6, Dec. 2002, pp. 902-912.

* cited by examiner

DECODING DEVICE AND DECODING METHOD

TECHNICAL FIELD

The present invention relates to a decoding apparatus and decoding method, and more particularly, to a decoding apparatus and decoding method performing turbo decoding using the Max-Log-MAP algorithm.

BACKGROUND ART

In recent years, as a most promising candidate for the system to be adopted in 4th generation mobile communications, attention has been directed toward VSF-OFCDM (Variable Spreading Factor-Orthogonal Frequency and Code Division Multiplexing). The adoption of VSF-OFCDM enables the maximum transmission rate of 100 Mbps or more using a bandwidth of about 50 to 100 MHz. It is effective to apply turbo coding and decoding for such a super-high-rate communication system as an error correcting system.

The turbo coding and decoding system features performing both convolutional coding and interleaving on transmission data and repeating decoding in decoding the data. It is known that repeatedly decoding indicates excellent error correcting capabilities for not only random errors but also burst errors.

Procedures of turbo decoding will briefly be described below.

Processing procedures of turbo decoding are broadly divided into forward probability calculation, backward probability calculation and likelihood information calculation.

The forward probability a is calculated for each state by following equation (1):

$$\log \alpha_k(m) = \log \sum_{m' \exists (m' \to m)} e^{\log \alpha_{k-1}(m') + \log \gamma_k(b)} \quad \text{Eq. (1)}$$

In above Eq. (1), log α represents the forward probability in the logarithmic domain, k represents a time point, and m and m' represent states in the state transition trellis. In other words, the left side of Eq. (1) expresses the forward probability in state m at time point k in natural logarithm. Further, in above Eq. (1), log γ represents a transition probability in the logarithm domain, m'∃(m'→m) represents all states m' capable of transiting to the state m, and b represents combinations of transmission signals, i.e. available combinations of systematic bits and parity bits.

As can be seen from Eq. (1), the forward probability $\alpha_k$ is calculated from the forward probability $\alpha_{k-1}$ at previous time point (k−1).

The backward probability β is calculated for each state by following equation (2):

$$\log \beta_k(m) = \log \sum_{m' \exists (m' \to m)} e^{\log \beta_{k-1}(m') + \log \gamma_{k+1}(b)} \quad \text{Eq. (2)}$$

The calculation method is almost the same as in the forward probability, but distinguished in calculating the backward probability $\beta_k$ from the backward probability $\beta_{k+1}$ at later time point (k+1). In other words, the forward probability is calculated in the forward direction on the time axis, and in contrast thereto, the backward probability is calculated in the reverse direction on the time axis.

Next, the likelihood information $L(u_k)$ is calculated by following equation (3):

$$L(u_k) = \log \frac{\sum_{u_k=0} e^{\log \alpha_{k-1}(m') + \log \beta_k(m) + \log \gamma_k(b)}}{\sum_{u_k=1} e^{\log \alpha_{k-1}(m') + \log \beta_k(m) + \log \gamma_k(b)}} \quad \text{Eq. (3)}$$

In Eq. (3), the numerator denominator expresses computations on combinations of all state transitions where systematic bit $u_k=0$ in the transmission signal, and the denominator expresses computations on combinations of all state transitions where $u_k=1$.

Calculation of above equations (1) to (3) is very complicated, and an approximate expression expressed in equation (4) is used in the Max-Log-MAP algorithm that is one of algorithms of turbo decoding.

$$\log(e^A + e^B) = \max(A,B) + \log(1 + e^{-|A-B|}) \quad \text{Eq. (4)}$$

Transforming equations (1) and (2) using equation (4) respectively results in following equations (5) and (6).

$$\alpha_k(m) = \max(\alpha_{k-1}(m')_{m'} + \gamma_{k-1}(m', m)) \quad \text{Eq (5)}$$

$$\beta_k(m) = \max_{m'}(\beta_{k+1}(m') + \gamma_{k+1}(m', m)) \quad \text{Eq (6)}$$

Further, transforming equation (3) using these equations (5) and (6) results in following equation (7):

$$L(u_k) = \max_{(m'm)u_k=0}(\alpha_{k-1}(m') + \beta_k(m) + \gamma_k(m', m)) - \max_{(m'm)u_k=1}(\alpha_{k-1}(m') + \beta_k(m) + \gamma_k(m', m)) \quad \text{Eq (7)}$$

In turbo decoding using the Max-Log-MAP algorithm, the likelihood information $L(u_k)$ calculated using Eq. (7) is compared with threshold "0", and hard decision is made such that the systematic bit $u_k$ transmitted at time point k is "1" ($u_k=1$) when the likelihood information $L(u_k)$ is "0" or more, while being made such that the systematic bit transmitted at time point k is "0" ($u_k=0$) when the likelihood information $L(u_k)$ is less than "0".

Herein, as expressed in Eq. (7), required to calculate the likelihood information at time point k are the forward probability $\alpha_{k-1}$ at time point (k−1), and the backward probability $\beta_k$ and transition probability $\gamma_k$ at time point k. At this point, it is necessary to calculate the forward probability and backward probability at time points 1 to k and then store probability values of all the states at all the time points to calculate the likelihood information, and therefore, the memory amount becomes enormous.

To reduce the memory amount, for example, following calculation procedures are considered. First, backward probabilities are calculated for time points k to 1, and stored in the memory. The forward probability is next calculated for each time point, and using this forward probability and already calculated backward probability, the likelihood information is successively calculated. According to this method, since the calculated forward probability is immediately used for calculating the likelihood information, the calculated forward probability is not stored and the memory amount corresponding to storage of the forward probability can be reduced.

Further, as a method of reducing the memory amount to store the backward probability, for example, there is a sliding window method as described in Non-patent Document 1. The sliding window method is a method that, by the entire data sequence is divided into predetermined unit windows and training periods are provided in windows, calculates backward probability that should be calculated from backmost one of the sequence from some midpoint of the sequence. According to the sliding window method, it is only required to store backward probabilities on a window basis, and the memory amount can be reduced significantly as compared with the case of storing all the backward probabilities of time points k to 1.

Figure 1A:
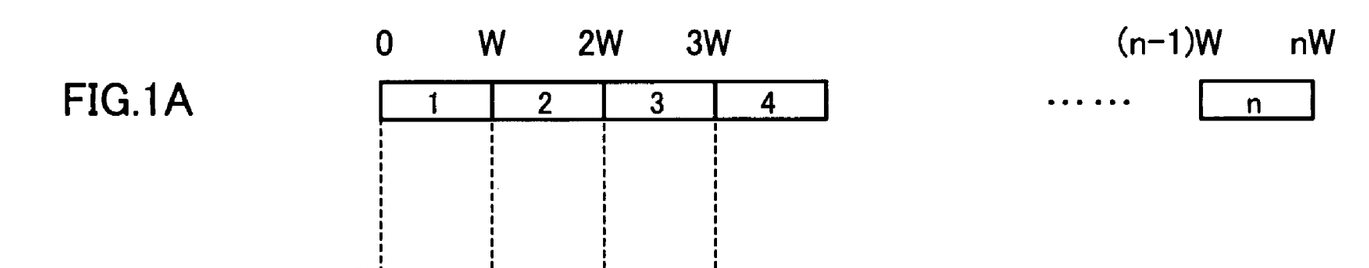
FIG. 1 is an explanatory view of processing using windows.
Figure 1B:
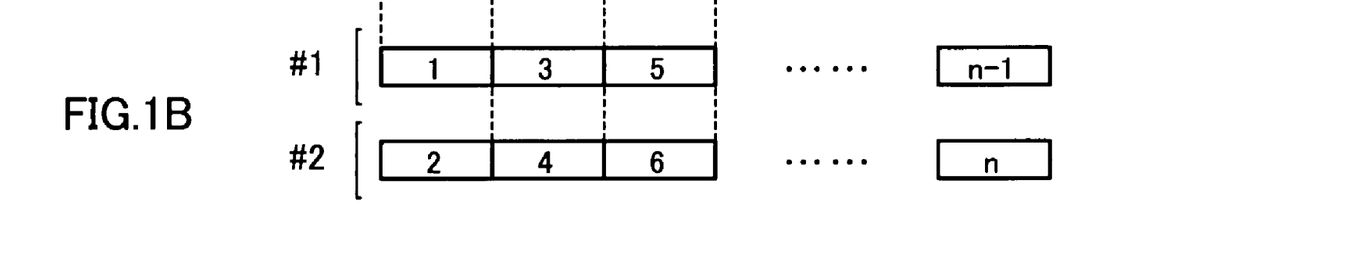

Furthermore, in the sliding window method, by computing the probability value and likelihood information in parallel, the speed of computation is increased. In other words, for example, when data with the entire sequence length nW is divided into n windows as shown in FIG. 1A, processing the windows in parallel increases the speed of computation. For example, as shown in FIG. 1B, by performing parallel computations in two processing systems #1 and #2, the computing time is reduced to half.

[Non-patent Document 1] Andrew J. Viterbi, "An Intuitive Justification and a Simplified Implementation of the MAP Decoder for Convolutional Codes", IEEE J. Sel. Areas Commun., vol. 16, no. 2, pp. 260-264, February 1998

DISCLOSURE OF INVENTION

Problems to be Solved by the Invention

However, even in the case of using the sliding window method in parallel as described above, there is a problem that a processing delay arises corresponding to the window size. Particularly, when the likelihood information $L(u_k)$ is calculated using the Max-Log-MAP algorithm, it is necessary to calculate the information in ascending order of time point k, but the probability value required to calculate the likelihood information $L(u_k)$ is calculated serially in windows, and therefore, a delay eventually arises in calculating the likelihood information $L(u_k)$ even when windows are processed in parallel.

This problem will specifically be described below with reference to FIGS. 2A to 2C.

Figure 2A:
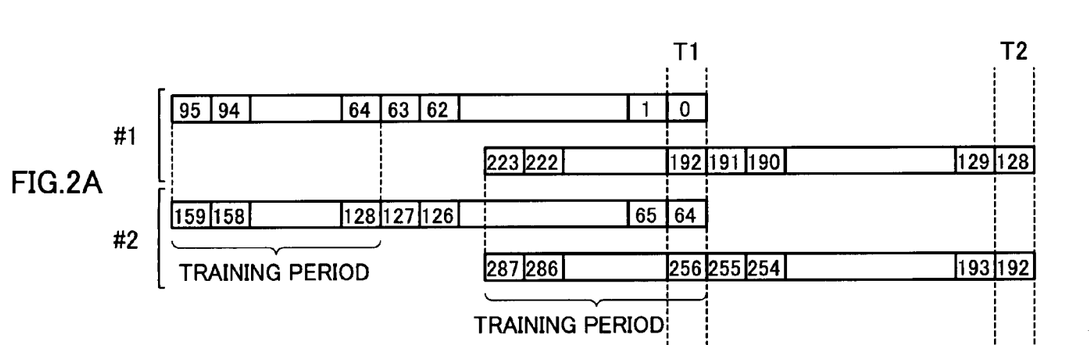
FIG. 2 is a chart showing an example of timing of decoding operation using a sliding window method.
Figure 2B:
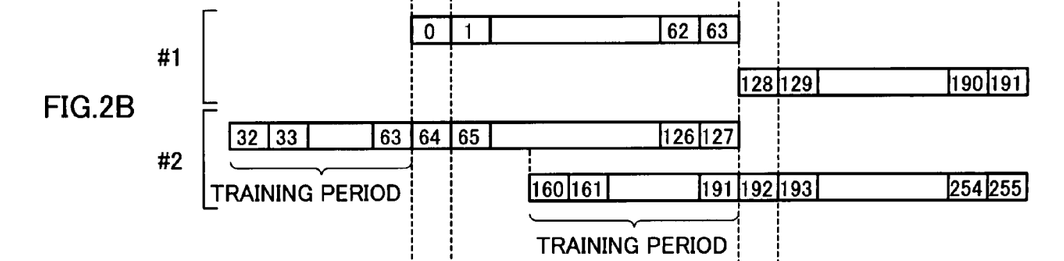
Figure 2C:
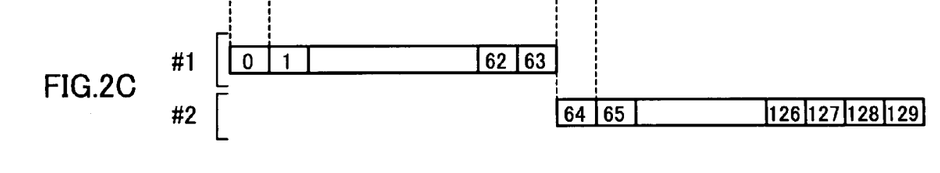

FIGS. 2A to 2C show an example of timing to calculate the likelihood information $L(u_k)$ with two processing systems #1 and #2 when the window size is 64 in the sliding window method. FIG. 2A illustrates timing to calculate the backward probability $\beta_k$. FIG. 2B illustrates timing to calculate the forward probability $\alpha_k$. FIG. 2C illustrates timing to calculate the likelihood information $L(u_k)$.

In FIG. 2A, a training period is provided to calculate backward probabilities $\beta_{63}$ to $\beta_0$ and backward probabilities $\beta_{127}$ to $\beta_{64}$. First one ($\beta 95$ or $\beta_{159}$ herein) of the training period is always assumed to be "0", and above Eq. (6) is computed in the training period, and it is thus possible to properly calculate backward probabilities $\beta_{63}$ to $\beta_0$ and backward probabilities $\beta_{127}$ to $\beta_{64}$ in the windows. Accordingly, the training period requires the size of at least about 20.

In FIG. 2A, calculation of backward probabilities $\beta_0$ and $\beta_{64}$ is finished at time T1. Processing systems #1 or #2 subsequently calculate backward probabilities $\beta_{191}$ to $\beta_{128}$ and backward probabilities $\beta_{255}$ to $\beta_{192}$ respectively.

Then, as shown in FIG. 2B, calculation of forward probabilities $\alpha_0$ to $\alpha_{63}$ and forward probabilities $\alpha_{64}$ to $\alpha_{127}$ is started from time T1. At this point, with respect to calculation of forward probabilities $\alpha_{64}$ to $\alpha_{127}$, $\alpha_{32}$ is assumed "0", and $\alpha_{32}$ to $\alpha_{63}$ is a training period.

Meanwhile, as shown in FIG. 2C, calculation of likelihood information $L(u_0)$ to $L(u_{63})$ is started from time T1. At time T1, the backward probabilities $\beta_0$ to $\beta_{63}$ have been already calculated, and the forward probability $\alpha_0$ is also calculated. Therefore, processing system #1 is capable of calculating the likelihood information $L(u_0)$.

However, at time T1, despite the backward probabilities $\beta_{64}$ to $\beta_{127}$ being already calculated and the forward probability $\alpha_{64}$ being also calculated, processing system #2 cannot calculate the likelihood information $L(u_{64})$ and is waiting. This is because the likelihood information $L(u_k)$ needs to be calculated in ascending order of time point k, but the likelihood information $L(u_0)$ is only calculated at time T1, and the likelihood information $L(u_{63})$ is calculated later in processing system #1.

Accordingly, as shown in FIG. 2C, likelihood information $L(u_0)$ to $L(u_{63})$ is calculated in processing system #1 from time T1, and likelihood information $L(u_{64})$ to $L(u_{127})$ is calculated in processing system #2 from time T2.

In other words, despite calculation of the backward probabilities and forward probability being finished, it is not possible to perform parallel processing in calculating the likelihood information, and the processing delay occurs corresponding to the window size. It is required to decrease the window size so that the processing delay is decreased, but a decrease in window size increases the number of windows, and thereby increases the processing amount on the training period. The training period does not contribute to actual decoding, and therefore, an increase in processing amount on the training period increases the entire processing amount, and as a result, may increase the circuit scale.

It is an object of the present invention to provide a decoding apparatus and decoding method that are enable to calculate the likelihood information at high speed while suppressing increases in processing amount and in circuit scale.

Means for Solving the Problem

A decoding apparatus of the invention is a decoding apparatus that performs decoding computations on a window of a predetermined size in parallel in a plurality of processing systems, and adopts a configuration having a forward probability computing section that sequentially computes a forward probability at a current time point from the forward probability at an earlier time point by the number of the plurality of processing systems in the window, a backward probability computing section that sequentially computes a backward probability at a current time point from the backward probability at a later time point by the number of the plurality of processing systems in the window, and a likelihood computing section that computes likelihood information using the forward probability and the backward probability.

A decoding method of the invention is a decoding method to perform decoding computations on a window of a predetermined size in parallel in a plurality of processing systems, and has the steps of sequentially computing a backward probability at a current time point from the backward probability at a later time point by the number of the plurality of processing systems in the window, sequentially computing a forward probability at a current time point from the forward probability at an earlier time point by the number of the plurality of processing systems in the window, and computing likelihood information using the forward probability and the backward probability whenever the forward probability is computed.

ADVANTAGEOUS EFFECT OF THE INVENTION

According to the present invention, it is possible to calculate the likelihood information at high speed while suppressing increases in processing amount and in circuit scale.

BEST MODE FOR CARRYING OUT THE INVENTION

One embodiment of the invention will specifically be described below with reference to accompanying drawings.

Figure 3:
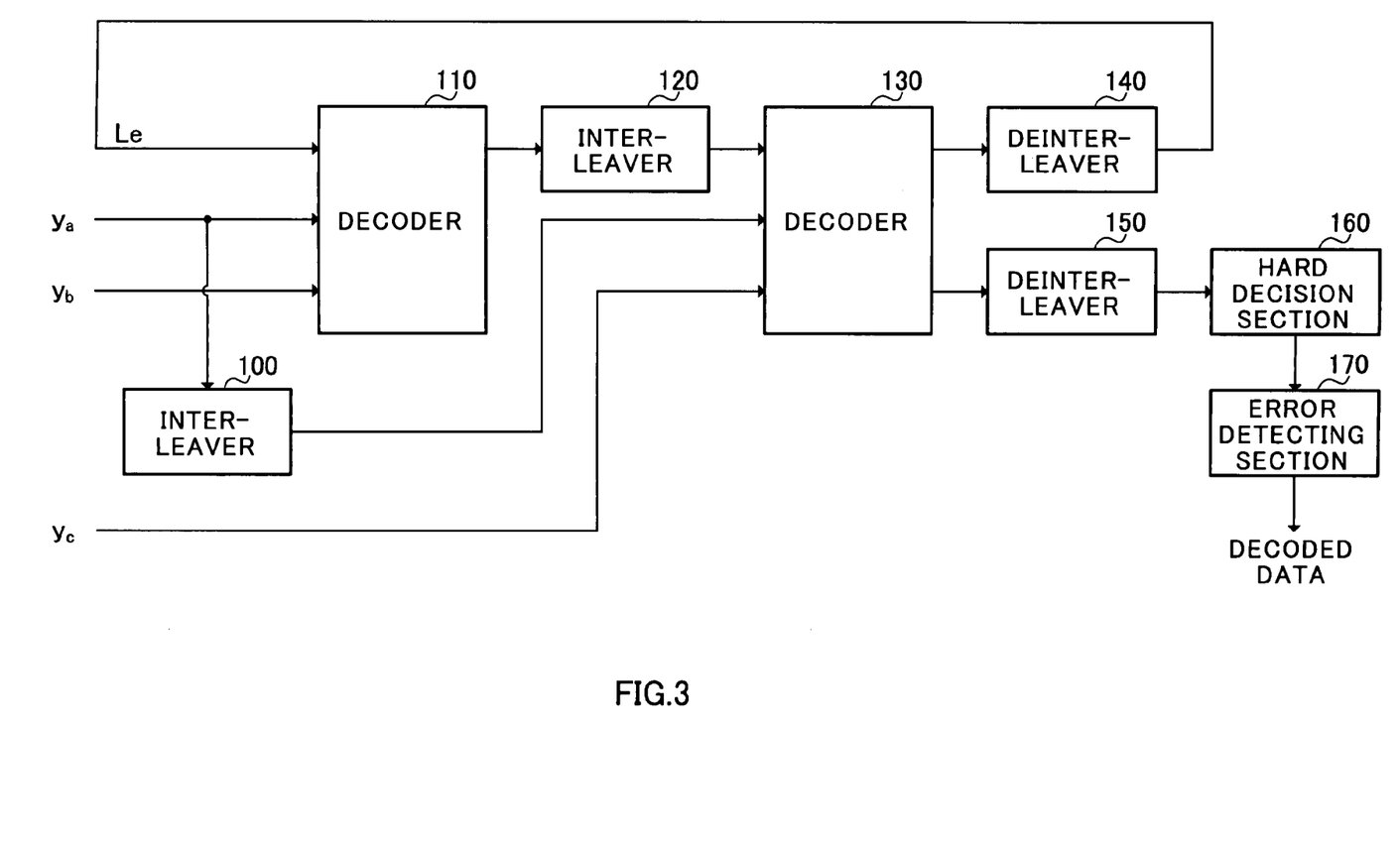
FIG. 3 is a block diagram illustrating an entire configuration of a decoding apparatus according to one embodiment of the invention.

FIG. 3 is a block diagram illustrating an entire configuration of a decoding apparatus according to one embodiment of the invention. The decoding apparatus as shown in the figure has interleaver 100, decoder 110, interleaver 120, decoder 130, deinterleaver 140, deinterleaver 150, hard decision section 160 and error detecting section 170. In addition, the decoding apparatuses as shown in FIG. 3 decode systematic bits $x_a$ that are information bits obtained by turbo coding, parity bits $x_b$ obtained by convolutional coding the information bits, parity bits $x_c$ obtained by convolutional coding interleaved information bits, and systematic bits $y_a$, parity bits $y_b$ and parity bits $y_c$ that are added with noise on the communication path.

Interleaver 100 interleaves the systematic bits $y_a$. Interleaving by interleaver 100 is performed in the same way as in interleaving on the coding side.

Decoder 110 is a soft-input soft-output decoder, performs decoding using earlier information likelihood $L_e$ obtained from a last decoding result, systematic bits $y_a$ and parity bits $y_b$, and outputs a decoding result to interleaver 120. Decoding in decoder 110 will specifically be described later.

Interleaver 120 interleaves the decoding result of decoder 110. Interleaving by interleaver 120 is performed in the same way as in interleaving on the coding side.

Decoder 130 is a soft-input soft-output decoder, performs decoding using the earlier information likelihood output from interleaver 120 and the systematic bits $y_a$ and parity bits $y_b$ output from interleaver 100, and outputs a decoding result to deinterleavers 140 and 150.

Deinterleavers 140 and 150 deinterleave the decoding result of decoder 130. Deinterleaving by deinterleavers 140 and 150 is performed to restore interleaving by interleavers 100 and 120 to the original order.

Hard decision section 160 makes a hard decision on the likelihood information output from deinterleaver 150, and outputs a hard decision value of "0" or "1". More specifically, hard decision section 160 compares the likelihood information output from deinterleaver 150 with "0" that is a threshold, and outputs "1" as a hard decision value when the likelihood information is "0" or more, while outputting "0" as a hard decision value when the likelihood information is less than "0".

Error detecting section 170 performs error detection using error detecting code such as CRC (Cyclic Redundancy Check) added to a hard decision result, and outputs decoded data.

Referring to FIG. 4 and FIGS. 5A to 5C, specific descriptions are given below of the operation in the decoder in the decoding apparatus configured as described above.

Figure 4:
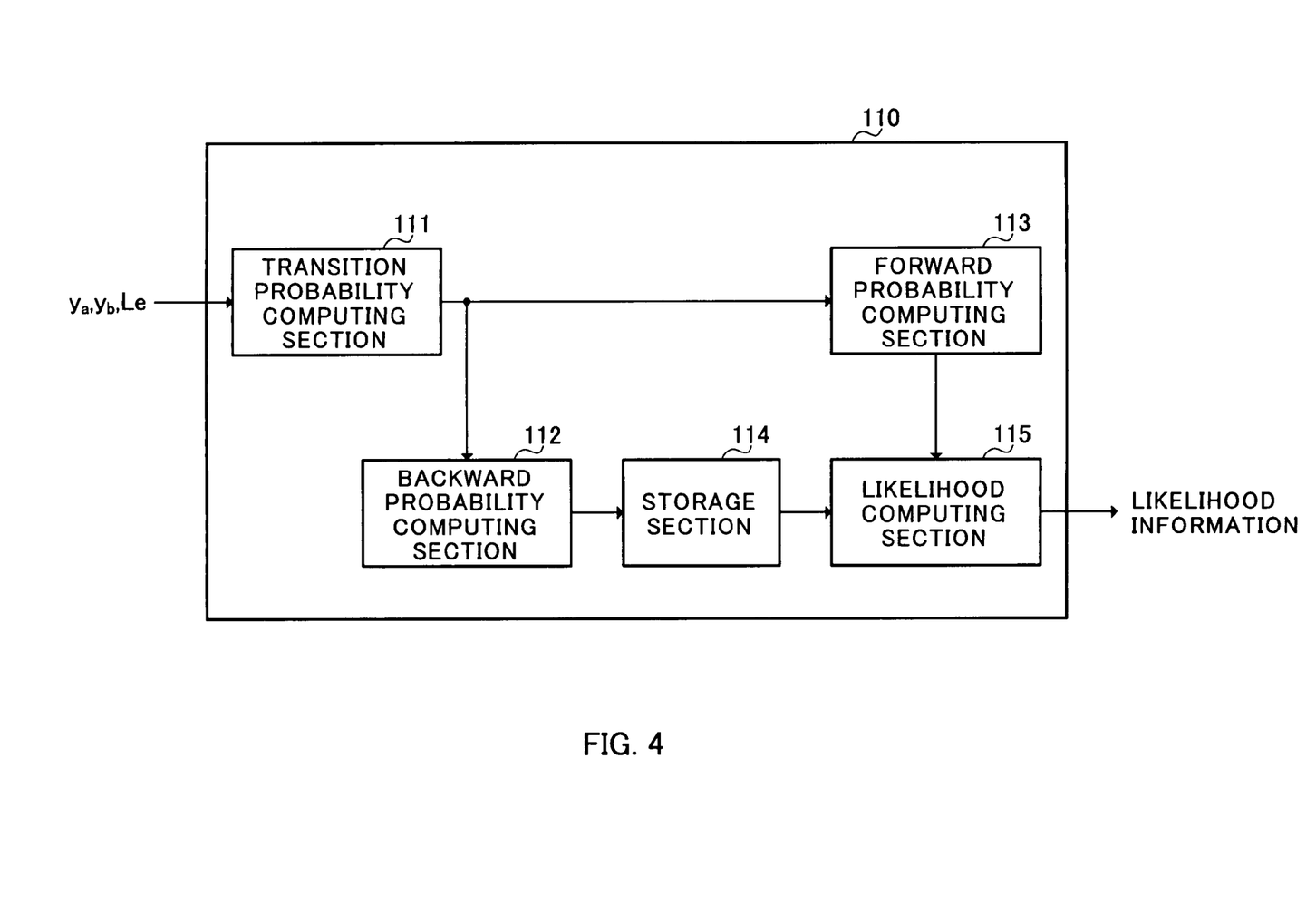
FIG. 4 is a block diagram illustrating an internal configuration of a decoder according to the one embodiment.

FIG. 4 is a block diagram illustrating an internal configuration of decoder 110.

As shown in the figure, decoder 110 has transition probability computing section 111, backward probability computing section 112, forward probability computing section 113, storage section 114 and likelihood computing section 115. In addition, it is assumed that decoder 130 has the same internal configuration as decoder 110, and that following decoding operation is performed for each window of a predetermined size.

Earlier information likelihood $L_e$ obtained from a last decoding result, systematic bits $y_a$ and parity bits $y_b$ are input to transition probability computing section 111, and the transition probability is computed. In the following, $\gamma_k(m',m)$ represents a transition probability of transition from state m' to state m in the state transition trellis at time point k.

The calculated transition probability $\gamma_k(m',m)$ is output to backward probability computing section 112 and forward probability computing section 113 respectively and the backward probability and forward probability are calculated. In the following, $\beta_k(m)$ represents a backward probability in state m at time point k, and $\alpha_k(m)$ represents a forward probability in state m at time point k.

Described herein is calculation of probability values in backward probability computing section 112 and forward probability computing section 113.

As described above, the forward probability $\alpha_k(m)$ and backward probability $\beta_k(m)$ are calculated respectively in equations (5) and (6). Equations (5) and (6) are transformed respectively to following equations (8) and (9).

$$\alpha_{k-1}(m) = \max_{m'} (\alpha_{k-2}(m') + \gamma_{k-2}(m', m)) \qquad \text{Eq. (8)}$$

$$\beta_{k+1}(m) = \max_{m'} (\beta_{k+2}(m') + \gamma_{k+2}(m', m)) \qquad \text{Eq. (9)}$$

Substituting these equations (8) and (9) again into equations (5) and (6) obtains following equations (10) and (11), respectively.

$$\begin{aligned}
\alpha_k(m) &= \max_{m'} \left( \max_{m''} (\alpha_{k-2}(m'') + \gamma_{k-2}(m'', m)) + \gamma_{k-1}(m', m) \right) \qquad \text{Eq. (10)} \\
&= \max_{m'} \left( \alpha_{k-2}(m'') + \max_{m''} (\gamma_{k-2}(m'', m) + \gamma_{k-1}(m', m)) \right) \\
&= \max_{m'} (\alpha_{k-2}(m'') + \mu_{k-2}(m'', m))
\end{aligned}$$

Note that $$\mu_{k-2}(m'', m) = \max_{m'} (\gamma_{k-2}(m'', m) + \gamma_{k-1}(m', m)).$$

-continued $$\beta_k(m) = \max_{m'}\left(\max_{m'}(\beta_{k+2}(m'') + \gamma_{k+2}(m'', m)) + \gamma_{k+1}(m', m)\right) \quad \text{Eq. (11)}$$
$$= \max_{m'}(\beta_{k+2}(m'') + \max_{m'}(\gamma_{k+2}(m'', m) + \gamma_{k+1}(m', m)))$$
$$= \max_{m'}(\beta_{k+2}(m'') + \eta_{k+2}(m'', m))$$

Note that
$$\eta_{k+2}(m'', m) = \max_{m'}(\gamma_{k+2}(m'', m) + \gamma_{k+1}(m', m)).$$

Eq. (10) expresses that the forward probability $\alpha_k$ at time point k is calculated from the forward probability $\alpha_{k-2}$ at time point (k−2), and Eq. (11) expresses that the backward probability $\beta_k$ at time point k is calculated from the backward probability $\beta_{k+2}$ at time point (k+2).

Backward probability computing section 112 and forward probability computing section 113 calculate the backward probability and the forward probability in parallel respectively using equations (10) and (11), in two processing systems. In other words, for example, in computations of the backward probability in backward probability computing section 112, while one processing system calculates the backward probability $\beta_k$ from the backward probability $\beta_{k+2}$, the other processing system calculates the backward probability $\beta_{k-1}$ from the backward probability $\beta_{k+1}$ in parallel. Specifically considering the case of k=1, backward probabilities $\beta_1$ and $\beta_0$ are calculated in parallel in two processing systems.

The calculated backward probabilities are stored in a storage section on a window basis. Further, similar to the backward probability, in forward probability computing section 113, forward probabilities $\alpha_k$ and $\alpha_{k+1}$ are calculated in parallel in two processing systems. When the forward probabilities are calculated, likelihood computing section 115 calculates the likelihood information by above-mentioned equation (7), using the forward probabilities and the backward probabilities stored in storage section 114.

At this point, as is different from the conventional technique, two processing systems in forward probability computing section 113 calculate the forward probabilities $\alpha_k$ and $\alpha_{k+1}$ and therefore, when the likelihood information $L(u_k)$ is calculated in ascending order of time point k, it is possible to calculate the likelihood information using at the same time the forward probabilities calculated by the two processing systems.

Timing for calculating the likelihood information will specifically be described below with reference to FIGS. 5A to 5C.

Figure 5A:
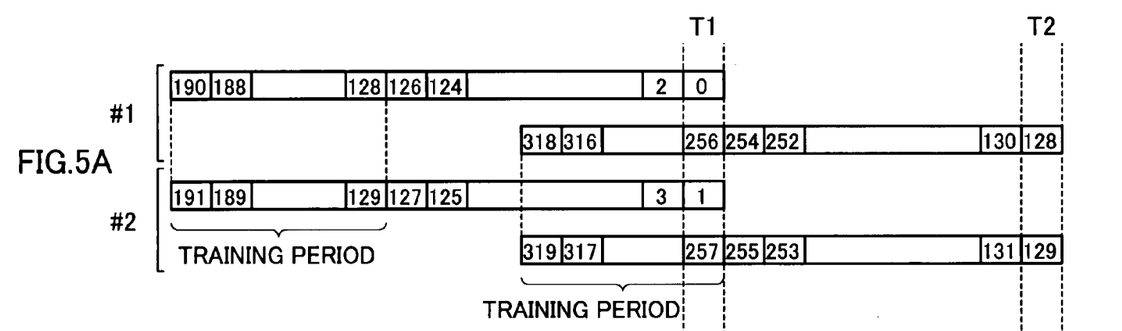
FIG. 5 is a chart showing an example of timing of decoding operation according to the one embodiment.

FIG. 5A illustrates calculation timing of the backward probability $\beta_k$ by two processing systems #1 and #2 in backward probability computing section 112. As shown in the figure, using $\beta_{190}$ to $\beta_{128}$ as a training period, processing system #1 sequentially calculates backward probabilities at even-numbered time points k among backward probabilities $\beta_{126}$ to $\beta_0$. Similarly, using $\beta_{191}$ to $\beta_{129}$ as a training period, processing system #2 sequentially calculates backward probabilities at odd-numbered time points k among backward probabilities $\beta_{127}$ to $\beta_1$. Then, backward probabilities $\beta_0$ and $\beta_1$ are calculated at time T1.

Figure 5B:
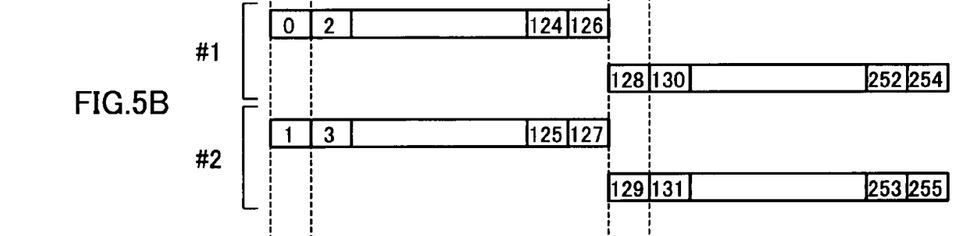

FIG. 5B illustrates calculation timing of the forward probability $\alpha_k$ by two processing systems #1 and #2 in forward probability computing section 113. As shown in the figure, processing system #1 sequentially calculates forward probabilities at even-numbered time points k from time T1 among forward probabilities $\alpha_0$ to $\alpha_{126}$. Similarly, processing system #2 sequentially calculates forward probabilities at odd-numbered time points k from time T1 among forward probabilities $\alpha_1$ to $\alpha_{127}$.

Figure 5C:
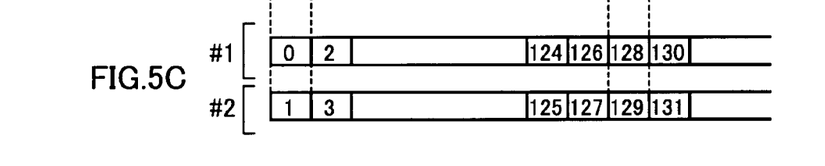

FIG. 5C illustrates calculation timing of the likelihood information $L(u_k)$ by two processing systems #1 and #2 in likelihood computing section 115. As shown in the figure, processing system #1 calculates the likelihood information $L(u_0)$ at time T1. Then, processing system #2 calculates the likelihood information $L(u_1)$ at time T1 using the forward probability $\alpha_0$ and backward probability $\beta_1$ already stored in storage section 114.

As is different from the conventional technique, processing system #2 is capable of performing parallel processing without waiting for calculation of the likelihood information $L(u_k)$. Therefore, as can be seen from comparison between FIGS. 2C and 5C, it is possible to greatly increase the speed of computation of the likelihood information $L(u_k)$.

Thus, according to this embodiment, since the processing systems calculate probability values at the current time point from probability values earlier or later time points corresponding to the number (two, herein) of the processing systems in parallel, the processing delay is eliminated in calculating the likelihood information using the probability values, and it is possible to calculate the likelihood information at high speed while suppressing increases in processing amount and in circuit scale.

In addition, it is described in this embodiment that the size of a training period is "32", and that the window size is "64", but the invention is not limited to these sizes. The size of the training period only needs to be about "20" or more.

Further, this embodiment describes the case of computing in parallel in two processing systems, but any numbers more than two are available as the number of processing systems. In this case, to consider in the same way as in equations (10) and (11), equations may be used that express the forward probability and the backward probability with the forward probability and the backward probability at time points earlier or later by the number of processing systems, respectively. In other words, assuming that the number of processing systems is m (m is an integer of two or more), probability values can be computed using equations that express the forward probability $\alpha_k$ and the backward probability $\beta_k$ with the forward probability $\alpha_{k-m}$ and the backward probability $\beta_{k+m}$, respectively.

Figure 6:
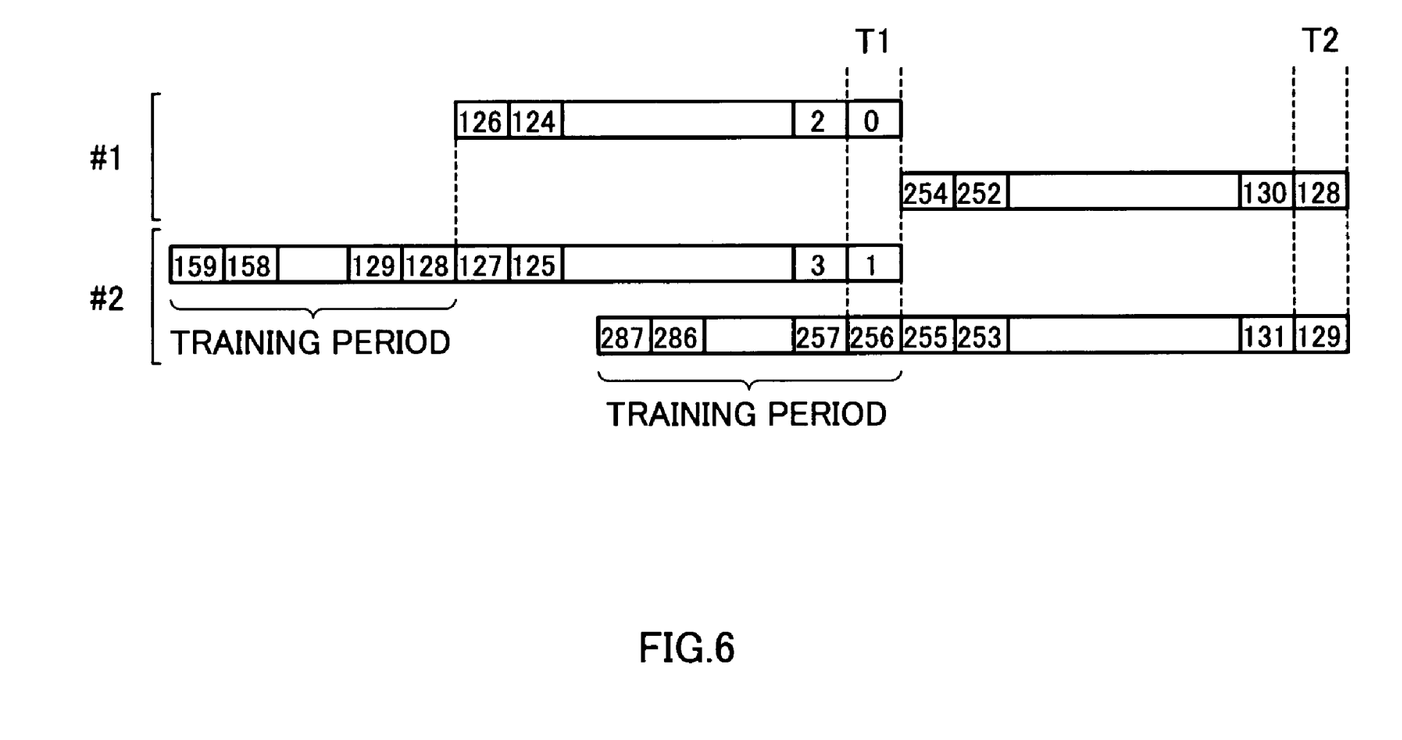
FIG. 6 is a chart showing another example of the decoding operation according to the one embodiment.

Furthermore, for example, as shown in FIG. 6, by performing consecutive computations on the training period in either one of processing systems and using a result of the training in all the processing systems, it is possible to further reduce the computation amount of the entire apparatus.

A decoding apparatus of the invention is a decoding apparatus that performs decoding computations on a window of a predetermined size in parallel in a plurality of processing systems, and adopts a configuration having a forward probability computing section that sequentially computes a forward probability at a current time point from the forward probability at an earlier time point by the number of the plurality of processing systems in the window, a backward probability computing section that sequentially computes a backward probability at a current time point from the backward probability at a later time point by the number of the plurality of processing systems in the window, and a likelihood computing section that computes likelihood information using the forward probability and the backward probability.

According to this configuration, since the forward probability and backward probability at the current time point are calculated from the forward probability and backward probability at earlier and later time points, corresponding to the number of processing systems, a plurality of processing systems is capable of computing probability values in parallel in windows, the likelihood computation of the latter stage is performed whenever the probability value is calculated, and it is possible to calculate the likelihood information at high speed, while suppressing increases in processing amount and in circuit scale.

The decoding apparatus of the invention adopts a configuration where the backward probability computing section computes the backward probability at the current time point using data at a later time point than the window as training data.

According to this configuration, the backward probability at the current time point is calculated using the data at the later time point than the window targeted for processing as the training data, and it is thus possible to perform computation processing of the backward probability on an arbitrary window.

The decoding apparatus of the invention adopts a configuration where the backward probability computing section uses common training data in the plurality of processing systems.

According to this configuration, since a plurality of processing systems uses the common training data, it is possible to reduce the computation amount required for the training data, and to further reduce the processing amount of the entire apparatus.

A base station apparatus of the invention adopts a configuration having any one of decoding apparatuses as described above.

According to this configuration, it is possible to achieve in the base station apparatus the same advantageous effect as in any one of the decoding apparatuses as described above.

A mobile station apparatus of the invention adopts a configuration having any one of decoding apparatuses as described above.

According to this configuration, it is possible to achieve in the mobile station apparatus the same advantageous effect as in any one of the decoding apparatuses as described above.

A decoding method of the invention is a decoding method to perform decoding computations on a window of a predetermined size in parallel in a plurality of processing systems, and has the steps of sequentially computing a backward probability at a current time point from the backward probability at a later time point by the number of the plurality of processing systems in the window, sequentially computing a forward probability at a current time point from the forward probability at an earlier time point by the number of the plurality of processing systems in the window, and computing likelihood information using the forward probability and the backward probability whenever the forward probability is computed.

According to this method, since the forward probability and backward probability at the current time point are calculated from the forward probability and backward probability at earlier and later time points, corresponding to the number of processing systems, a plurality of processing systems is capable of calculating probability values in parallel in windows, the likelihood computation of the latter stage is performed whenever the probability value is calculated, and it is possible to calculate the likelihood information at high speed, while suppressing increases in processing amount and in circuit scale.

This application is based on Japanese Patent Application No. 2003-273378 filed on Jul. 11, 2003, entire content of which is expressly incorporated by reference herein.

The invention claimed is:

1. A decoding apparatus for performing decoding computations on a window of a predetermined size in parallel in a plurality of processing systems, using a sliding window method and a Max-LOG-MAP algorithm, comprising:
   a forward probability computing section for sequentially computing in parallel in each of the processing systems a forward probability corresponding to a current time point indexed k from the forward probability corresponding to an earlier time point indexed k−n, wherein n is the number of the plurality of processing systems, at an index interval in the window corresponding to the number n of the plurality of processing systems, wherein the current time point index in each of the processing systems is shifted sequentially by one;
   a backward probability computing section for sequentially computing in parallel in each of the processing systems a backward probability corresponding to a current time point indexed k from the backward probability corresponding to a later time point indexed k+n and at an index interval in the window corresponding to the number n of the plurality of processing systems, wherein the current time point index in each of the processing systems is shifted sequentially by one; and
   a likelihood computing section for computing likelihood information in parallel in each of the processing systems using the forward probability and the backward probability.

2. The decoding apparatus according to claim 1, wherein the backward probability computing section computes the backward probability corresponding to the current time point using data at a later time point than the window targeted for processing at the current time point as training data.

3. The decoding apparatus according to claim 2, wherein the training data used in the backward probability computing section is common in the plurality of processing systems.

4. A base station apparatus having the decoding apparatus according to claim 1.

5. A mobile station apparatus having the decoding apparatus according to claim 1.

* * * * *